US006887795B2

(12) United States Patent
Soininen et al.

(10) Patent No.: US 6,887,795 B2
(45) Date of Patent: May 3, 2005

(54) METHOD OF GROWING ELECTRICAL CONDUCTORS (75) Inventors: Pekka J. Soininen, Espoo (FI); Kai-Erik Elers, Helsinki (FI); Suvi Haukka, Helsinki (FI)

(73) Assignee: ASM International N.V., Bilthoven (NL)

( * ) Notice: Subject to any disclaimer, the term of this patent is extended or adjusted under 35 U.S.C. 154(b) by 190 days.

(21) Appl. No.: 10/300,169

(22) Filed: Nov. 19, 2002

(65) Prior Publication Data

US 2003/0096468 A1 May 22, 2003

Related U.S. Application Data (63) Continuation of application No. 09/858,820, filed on May 15, 2001, now Pat. No. 6,482,740.

(30) Foreign Application Priority Data

May 15, 2000 (FI) .............................................. 20001163

(51) Int. Cl.[7] ...................... H01L 21/302; H01L 21/461
(52) U.S. Cl. ........................................ 438/722; 438/584
(58) Field of Search ................................ 438/722, 648, 438/650, 580, 582, 584, 680, 681, 683, 685, 686, 687

(56) References Cited

U.S. PATENT DOCUMENTS

| | | | |
|---|---|---|---|
| 4,058,430 A | 11/1977 | Suntola et al. | |
| 4,477,296 A | 10/1984 | Nair | |
| 5,382,333 A | 1/1995 | Ando et al. | |
| 5,711,811 A | 1/1998 | Suntola et al. | |
| 5,731,634 A | 3/1998 | Matsuo et al. | |
| 5,865,365 A | 2/1999 | Nishikawa et al. | |
| 5,916,365 A | 6/1999 | Sherman | 117/92 |
| 5,923,056 A * | 7/1999 | Lee et al. | 257/192 |
| 5,939,334 A | 8/1999 | Nguyen et al. | |
| 6,006,763 A | 12/1999 | Mori et al. | |
| 6,033,584 A | 3/2000 | Ngo et al. | |
| 6,066,892 A | 5/2000 | Ding et al. | |
| 6,124,189 A | 9/2000 | Watanabe et al. | |
| 6,130,123 A | 10/2000 | Liang et al. | |
| 6,144,060 A * | 11/2000 | Park et al. | 257/310 |
| 6,203,613 B1 * | 3/2001 | Gates et al. | 117/104 |
| 6,297,539 B1 * | 10/2001 | Ma et al. | 29/76 |
| 6,303,500 B1 | 10/2001 | Jiang et al. | |
| 6,305,314 B1 * | 10/2001 | Sneh et al. | 118/723 |
| 6,323,131 B1 | 11/2001 | Obeng et al. | |

(Continued)

FOREIGN PATENT DOCUMENTS

| | | |
|---|---|---|
| EP | 0 469 470 A1 | 2/1992 |
| EP | 0 880 168 A2 | 11/1998 |
| WO | WO 93/10652 | 5/1993 |

OTHER PUBLICATIONS

SOI Technology: IBM's Next Advance in Chip Design, Date unknown.

(Continued)

*Primary Examiner*—David Nhu
(74) *Attorney, Agent, or Firm*—Knobbe, Martens, Olson & Bear, LLP (57) ABSTRACT

This invention relates to manufacturing of integrated circuits (ICs) and especially conductive layers suitable for use in an IC. According to the preferred method a metal oxide thin film is deposited on a substrate surface and reduced thereafter essentially into a metallic form with an organic reducing agent. The metal oxide is preferably deposited according to the principles of atomic layer deposition (ALD) using a metal source chemical and an oxygen source chemical. The reduction step is preferably carried out in an ALD reactor using one or more vaporized organic compounds that contain at least one functional group selected from the group consisting of —OH, —CHO and —COOH.

32 Claims, 4 Drawing Sheets

U.S. PATENT DOCUMENTS

| | | | |
|---|---|---|---|
| 6,342,277 | B1 | 1/2002 | Sherman ..................... 427/562 |
| 6,346,151 | B1 | 2/2002 | Jiang et al. |
| 6,433,432 | B2 | 8/2002 | Shimizu |
| 6,444,568 | B1 | 9/2002 | Sundararajan et al. |
| 6,482,740 | B2 * | 11/2002 | Soininen et al. ............ 438/686 |
| 6,576,053 | B1 * | 6/2003 | Kim et al. ..................... 117/89 |
| 2001/0003064 | A1 | 6/2001 | Ohto |
| 2001/0018266 | A1 | 8/2001 | Jiang et al. |
| 2001/0052318 | A1 | 12/2001 | Jiang et al. |
| 2002/0013487 | A1 | 1/2002 | Norman et al. |
| 2002/0027286 | A1 | 3/2002 | Sundararajan et al. |

OTHER PUBLICATIONS

Baglia, J., Associate Editior, "New Designs and Materials Tackle 1 Gb Memory Challenge," *Semiconductor International*, World Wide Web address: semiconductor.net, Nov. 2000.

Basceri, C., Ph.D. thesis, "Electrical and Dielectric Properties of (BA,SR) $TiO_3$ Thin Film Capacitors for Ultra–High Density Dynamic Random Access Memories," pp. 13–31, Raleigh, N.C. State University (1997).

Bursky, D., "Hit Up IEDM For Gigabit And Denser DRAMs And Merged Logic/Memory," *Electronic Design*, World Wide Web address: planetee.com (Dec. 1, 1998).

Campbell, S.A. et al., "Titanium dioxide ($TiO_2$)–based gate insulators," *IBM J. Res. Develop.*, vol. 43, No. 3, pp. 383–392 (May 1999).

Fukuzumi, Y. et al., "Liner–Supported Cylinder (LSC) Technology to Realize $Ru/Ta_2O_5/Ru$ Capacitor for Future DRAMs," *IEEE*, IED 2000, Session 34 (2000).

Hones, P. et al., "MOCVD of ThinRuthenium Oxide Films: Properties and Growth Kinetics," *Chem. Vap. Deposition*, vol. 6, No. 4, pp. 193–198 (2000).

Inoue, N. et al., "Low thermal–budget fabrication of sputtered–PZT capacitor on multilevel interconnects for embedded FeRAM," *IEEE*, IED 2000, Session 34 (2000).

Integrated Circuit Engineering Corporation, Practical Integrated Circuit Fabrication Seminar (1998).

Jung, D. et al., "A Novel $Ir/IrO_2/Pt$–PZT–$Pt/IrO_2/Ir$ Capacitor for a Highly Reliable Mega–Scale FRAM," *IEEE*, IED 2000, Session 34 (2000).

Kawamoto, Y. et al., "The Outlook for Semiconductor Processes and Manufacturing Technologies in the 0.1–$\mu$m Age," *Hitachi Review*, vol. 48, No. 6, pp. 334–339 (1999).

NEC Device Technology International, No. 48, pp. 4–8 (1998).

Onda, N. et al., "Hydrogen Plasma Cleaning a Novel Process for IC–Packaging," p. 311, World Wide Web Address: Semiconductor Fabtech.com (1998).

Solanki, R. et al., "Atomic Layer Deposition of Copper Seed Layers," *Electrochemical and Solid–State Letters*, vol. 3, No. 10, pp. 479–480 (2000).

Sundani et al., "Oral presentation of dual damascene process," slides.

Utriainen, M. et al., "Studies of NiO thin film formation by atomic layer epitaxy," *Materials Science & Engineering*, vol. B54, pp. 98–103 (1998).

Utriainen, M. et al., "Studies of metallic thin film growth in an atomic layer epitaxy reactor using $M(acac)_2$ (M = Ni, CuI Pt) precursors," *Applied Surface Science*, vol. 157, pp., 151–158 (2000).

Winbond News Release, World Wide Web address: winbond.com (Dec. 13, 2000).

Won, Seok–Jun et al., "Conformal CVD–Ruthenium Process for MIM Capacitor in Giga–bit DRAMs," *IEEE*, IED 2000, Session 34 (2000).

Xu, P. et al., "A Breakthrough in Low-k Barrier/Etch Stop Films for Copper Damascene Applications," *Semiconductor Fabtech*, 11th Edition, p. 239 (2000).

Yoon, Dong–Soo et al., "Tantalum–ruthenium dioxide as a diffusion barrier between Pt bottom electrode and $TiSi_2$ ohmic contact layer for high density capacitors," *Journal of Applied Physics*, vol. 86, No. 5, pp. 2544–2549 (1999).

Yoon, Dong–Soo et al., "Investigatin of $RuO_2$–Incorporated Pt Layer as a Bottom Electrode and Diffusion Barrier for High Epsilon Capacitor Applications," *Electrochemical and Solid–State Letters*, vol. 3, No. 8, pp. 373–376 (2000).

Yoon, Y.–G. et al., 197th Meeting Program Information II, The Electrochemical Society, 197th Meeting—Toronto, Ontario, Canada, May 14–18, 2000, Program Information, 11—Rapid Thermal and Other Short–Time Processing Technologies 1, Electronics Division/Dielectric Science and Technology Division/High Temperature Materials Division, 2000, Wednesday, May 17, 2000, New Applications of RTP, Co–Chairs: A. Fiory and D.–L Kwong, time 11:10 Abs#550, Title: Development of RTA Process for the Crystallization of a–Si Thin Film—Y.–G. Yoong, T.–K. Kim, K.–B. Kim J.–Y. Chio, B.–I Lee, and S.–K. Joo (Seoul National Univ.).

T. Yagishita et al., "Cleaning of Copper Surface Using Vapor–Phase Organic Acids," *MRS Proceedings*, vol. 766, MRS Spring 2003 Meeting, Apr. 21–25, 2003, Symposium E, Session E3, Paper E3.28.

* cited by examiner

METHOD OF GROWING ELECTRICAL CONDUCTORS

The present application is a continuation of U.S. patent application Ser. No. 09/858,820, filed May 15, 2001 now U.S. Pat. No. 6,482,740, which claims the benefit under 35 U.S.C. §119(a) of Finnish Patent Application No. 20001163, filed May 15, 2000.

BACKGROUND OF THE INVENTION

1. Field of the Invention

The present invention relates generally to the manufacturing of integrated circuits (ICs), and particularly to the seed layers in damascene and dual damascene processes, gate metals of thin film transistors and capacitor electrodes in ICs.

More particularly the present invention relates to a method of depositing seed layers for a damascene and dual damascene structures, gate metals of thin film transistors and capacitor electrodes in ICs by an atomic layer deposition (ALD) method.

2. Description of the Related Art

The atomic layer deposition (ALD) method of depositing thin films has several attractive features including excellent step coverage, even on large areas, and a dense and pinhole-free structure. Therefore, it is of great interest to apply ALD to the deposition of metallization layers of advanced integrated circuits (ICs), where the continuously increasing packing density and aspect ratio set higher and higher demands upon the metallization layers. Applications where high quality metallization is particularly needed are dual damascene structures, gates in transistors and capacitors in ICs. However, due to the fact that ALD is based on sequential self-saturating surface reactions of source chemical compounds, depositing high quality elemental metal thin films by ALD is very difficult.

In ALD, the source chemical molecules chemisorb on the substrate via active sites on the substrate surface. Typical active sites for metal source chemicals are —OH, —NH$_2$ and >NH groups. Metal-oxygen-metal bridges on the surface may also act as active sites. When a metal source chemical molecule reacts with the active site, a strong bond is formed between the surface and the ligand of the source chemical molecule is simultaneously released as a by-product.

In ALD, films grow with a constant growth rate. Each deposition cycle produces one molecular layer of the deposited material on the substrate surface. Usually the growth rate is well below one molecular layer/cycle because the adsorbed source chemical molecules may be bulky or because substrate temperature affects the number of active sites (e.g. —OH groups) on the surface. It is well known that metal oxide thin films produced by ALD are uniform, have excellent adhesion and thus are firmly bonded to the substrate surface.

Experiments have revealed a drawback of the growth of metal thin films by an ALD type method. In the case of metal deposition it is difficult to attach source chemical molecules to the surface because essentially no active sites exist on the surface. The metal film grown is often non-uniform over an area of the substrate and it is easily peeled off from the surface, which indicates very poor adhesion of the film to the substrate.

Several attempts have been made to produce metal thin films by ALD type methods. Reproducibility of such an ALD metal growth process has traditionally been poor and the reactions do not take place at all on insulating surfaces like silicon oxide. There are publications about the ALD deposition of Cu metal by pulsing a copper compound, e.g. Cu(thd)$_2$, on a surface and then reducing the Cu(thd)$_2$ molecules bound to the surface into Cu with H$_2$.

R. Solanki et al. (Electrochemical and Solid-State Letters 3 (2000) 479–480) have deposited copper seed layers by ALD. They deposited copper directly from alternate pulses of bis(1,1,1,5,5,5-hexafluoroacetylacetonato)copper(II) hydrate and either methanol, ethanol or formalin, i.e. a water solution of formaldehyde. The total pulsing cycle time was 64 s, i.e. slightly over one minute. Although the growth rate was not mentioned in the publication, a typical growth rate of a thin film made by ALD from metal β-diketonates is 0.03 nm/cycle due to the steric hindrance of the source chemical molecules. Thus, the deposition time for a 10 nm copper seed layer would be over 5 hours, which is uneconomical for wafer processing. A required minimum throughput of a wafer reactor is 10–12 wafers/hour. It is to be noted that according to Strem Chemicals, Inc. the decomposition temperature of the copper compound used by R. Solanki et al. is 220° C. R. Solanki et al. noticed copper film growth when the substrate temperature was 230–300° C. Therefore, partial thermal decomposition of copper source compound on substrate surface is probable.

One of the most advanced IC structures is the dual damascene structure which consists of a silicon substrate with transistors (source, gate and drain). Several electrically conducting layers are needed in the structure. The first metallization level is done with tungsten plugs and aluminium interconnects to prevent the contamination of the gate with copper. The remainder of the metallization levels are made of copper.

The process steps of a dual damascene process are described below.

Step 1. A silicon nitride etch stop is grown on the previous metallization surface.

Step 2. A via level dielectric is deposited.

Step 3. Another silicon nitride etch stop is deposited.

Step 4. A trench level dielectric is deposited. SiO$_2$ has been favoured as the dielectric material. Low-k materials such as nitrided silicon oxide and polymers have been experimented with as an alternative dielectric material.

Step 5. Patterning of dielectric by photolithography.

a. A resist layer is deposited on dielectrics surface.

b. The resist layer is patterned and the resist is removed from the via areas.

c. Dielectrics are etched from the via areas with directional plasma. Etching terminates at the silicon nitride surface.

d. Resist is stripped from the surface.

Step 6. Patterning of the etch stop layer by photolithography.

e. A second resist layer is deposited on the surface.

f. The resist layer is patterned and it is removed from the trench areas.

g. Silicon nitride is removed with a short plasma nitride etch from the bottom of the holes that were made with the first plasma oxide etch.

h. The second plasma oxide etch removes silicon dioxide from the exposed via and trench areas until the first silicon nitride etch stop is reached.

i. The first silicon nitride etch stop is removed from the via bottom and the second silicon nitride etch stop from the trench bottom with a short plasma nitride etch.

j. The resist is stripped from the substrate.

Step 7. A diffusion barrier layer is grown on all exposed surfaces.

Step 8. A seed layer for copper deposition is grown with CVD or PVD on the diffusion barrier layer.

Step 9. Vias and trenches are filled with copper by an electroplating process.

Step 10. The substrate surface is planarized with chemical mechanical polishing (CMP). The surface is polished until copper and a barrier layer are left only in trenches and vias.

Step 11. The surface is capped with a silicon nitride etch stop layer.

Step 12. The metallization process is then repeated for all the remaining metallization levels.

Alternatives for copper electroplating (Step 9) are electroless plating, physical vapor deposition (PVD) and chemical vapor deposition (CVD). A seed layer (c.f. Step 8) is only needed for the electroplating process. Traditionally such a seed layer is deposited by chemical vapor deposition (CVD) or physical vapor deposition (PVD). In the electroplating process the substrate having an electrically conductive seed layer is immersed in a metal compound solution. The electrically conductive surface of the substrate is connected to an external DC power supply. A current passes through the substrate surface into the solution and metal is deposited on the substrate. The seed layer has high conductivity and it acts as a conduction and nucleation layer for the electroplating process. One can envision a seed layer that acts as a nucleation layer for the CVD process. The seed layer carries current from the edge of the wafer to the center of the wafer and from the top surface of the wafer into the bottom of vias and trenches. A uniform and continuous seed layer is necessary to get uniform electroplated copper. Electrical contact is made to the seed layer. The quantity of the deposited metal is directly proportional to the local current density on the substrate.

The benefits of copper compared to aluminum are lower resistivity and better resistance to electromigration. Furthermore, since tighter packing density can be obtained with copper, fewer metallization levels are needed and the manufacturing costs are lower than with aluminum. With increasing aspect ratio it is becoming difficult to get sufficient step coverage for the seed layer with the state of the art technology.

In dynamic random access memories (DRAM), capacitors store data bits in the form of electrical charge. These memory capacitors must be recharged frequently due to the leaking of electrons. The simplest capacitor consists of two parallel metallic plates separated with a dielectric material. The capacity (C) of this plate capacitor depends according to equation (I) on the area (A) of the metallic plate, the distance (d) between the metallic plates and the dielectric constant (k) of the dielectric material. $\epsilon_0$ is the permittivity of space.

$$C = k\epsilon_0 A/d \quad (I)$$

Cylindrical capacitors are often used. The conductors are arranged coaxially. The charge resides on the inner wall of the outer conductor and on the outer surface of the inner conductor. In this case the capacitance (C) depends on the radius of the outer surface of the inner conductor (a), radius of the inner surface of the outer conductor (b), length of the cylinder (l) and dielectric constant (k) of the dielectric material between the conductors as shown in equation (II).

$$C = 2\pi k\epsilon_0 l/\ln(b/a) \quad (II)$$

The feature sizes in DRAMs are decreasing continuously. The capacitors must be made smaller in successive DRAM generation. In order to save surface area, planar capacitors are being replaced with vertical coaxial capacitors that may have aggressive aspect ratios. Decreasing the charge storing area means that the distance between the conductors must be decreased and/or the dielectric constant of the dielectric must be increased in order to keep the capacity sufficient. Decreasing the distance between the conductors causes voltage breakdown when the insulator thickness is too thin to hold the voltage.

Using high-k dielectrics, such as $TiO_2$ and $Ta_2O_5$, resolves the above described problem related to decreasing feature size. However, high-k dielectrics create new problems, since they donate oxygen to the conductor and thus the capacitor properties deteriorate. Therefore, inert metals, such as platinum group metals, or conductive metal oxides, such as $RuO_2$, must be used adjacent to the high-k metal oxides. But it is difficult to deposit thin films with good step coverage on new capacitor structures with small feature size and aggressive aspect ratio. As a conclusion, there is an increasing need for a method of producing conductive thin films with good step coverage and excellent thin properties such as adhesion to the substrate.

S.-J. Won et al. have presented a metal-insulator-metal (MIM) capacitor structure for giga-bit DRAMs (Technical Digest of the 2000 International Electron Devices Meeting (IDEM), San Francisco, Calif., Dec. 10–13, 2000). They used $Ta_2O_5$ as an insulator while the electrodes consisted of ruthenium which was deposited by CVD from $Ru(EtCp)_2$ gaseous oxygen at 300–400° C. Problems related to the method included poor step coverage and reaction speed sensitivity. When the nodes were made with 0.08 $\mu$m design rules, the step coverage dropped to 60%. The reaction of $Ru(EtCp)_2$ with $O_2$ was adversely affected by the partial pressures of the said compounds.

$N^+$ or $p^+$ doped polycrystalline silicon has been used as a gate electrode for transistors. However, several problems are associated with the use of poly-Si gate electrodes. In the case of boron doped $p^+$ poly-Si, the diffusion of boron through the gate $SiO_2$ destroys the electrical properties of the transistor. Poly-Si is thermodynamically unstable against high dielectric constant materials at high processing temperatures. In addition, poly-Si has rather high resistivity compared to metals. There is a tendency to replace the $SiO_2$ gate oxide with a high dielectric constant metal oxide. A metal with appropriate work function would enable the tailoring of the CMOS threshold voltage. Refractory metals have been suggested for gate metals but the stability of the metal-gate oxide interface has been an issue. Platinum group metals are potential candidates for gate metals due to their inert nature. However, appropriate methods of depositing high-quality platinum group metal thin films for gate electrode applications have not yet been developed.

M. Utriainen et al. have demonstrated (Appl. Surf. Sci. 157 (2000) pp. 151–158) that ALD grown metal oxides can be used as interconnects in ICs after reducing the metal oxides into metals. They studied the direct ALD deposition of Cu, Ni and Pt and the indirect Ni growth method via reduction of NiO. However, they had problems with the quality of the nickel film: pinholes were formed on the thin films during the reduction of NiO with hydrogen gas.

SUMMARY OF THE INVENTION

The present invention provides methods of producing high quality conductive thin films with excellent step coverage, uniform thickness over a large area and excellent adhesion properties. The thin films may be used, for example, as seed layers for the electro-deposition of metal layers, and gate metals in thin film transistors and capacitors of advanced high-density integrated circuits.

The present method is applicable to the manufacture of conductive thin films, preferably comprising one or more of the following elements: rhenium, ruthenium, osmium, cobalt, rhodium, iridium, nickel, palladium, platinum, copper, silver and gold.

According to one embodiment of the present invention the conductive layer is formed by producing a metal oxide layer by an ALD type process and essentially converting the metal oxide into an elemental metal to provide sufficient conductivity for the thin film.

A surprising finding related to the present invention is that the film has very good adhesion to the substrate, even after a reduction step. The structural integrity of the metal film is preserved and the formation of pinholes in the film is avoided. While the exact nature of the interface between the metal film and the substrate is unclear, it is obvious that the interface is much stronger than in the case of direct deposition of metal films by ALD. However, the use of very efficient reducing agents, such as hydrogen gas, results in very poor adhesion of the reduced films.

The present invention is especially beneficial for making electrically conductive layers in structures that have high aspect ratios, like vias, trenches, local high elevation areas and other similar surface structures that make the surface rough and thin film processing complicated by conventional CVD and PVD methods. An ALD metal oxide process combined with a reduction step provides excellent step coverage of conductive thin films on all surface formations.

DETAILED DESCRIPTION OF THE DRAWINGS

Figure 1:
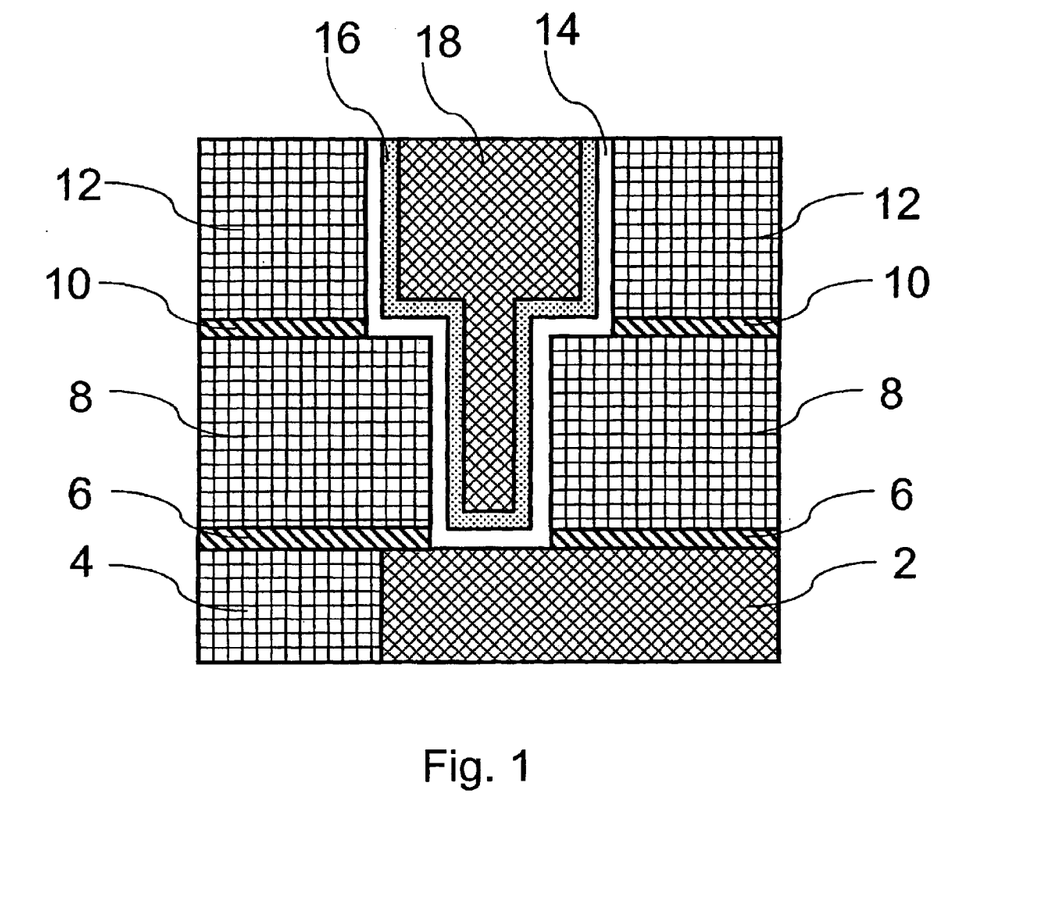
FIG. 1 is a schematic view of the dual damascene structure.

The dual damascene structure shown in FIG. 1 consists of a previous metallization layer 2, e.g. Cu, an insulating layer 4, e.g. $SiO_2$, a via etch stop 6 made of, e.g. $Si_3N_4$, a via level insulator 8, e.g. $SiO_2$, a trench etch stop 10, made of e.g. $Si_3N_4$, a trench level insulator 12, e.g. $SiO_2$, a diffusion barrier 14, e.g. TaN, a seed layer 16 and a via/trench fill metal 18, e.g. Cu.

Figure 2:
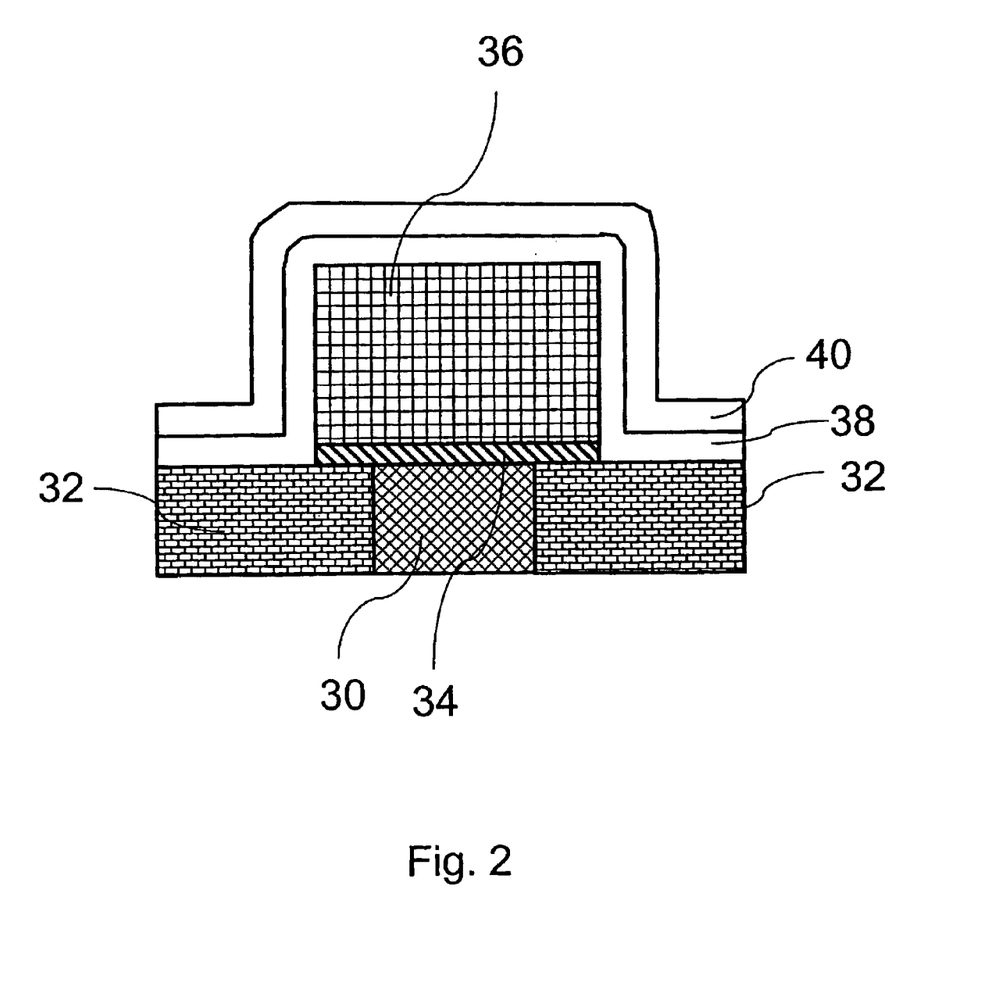
FIG. 2 is a schematic view of a capacitor structure.

The capacitor structure shown in FIG. 2 consists of a contact plug 30, e.g. tungsten (W) or polysilicon, an insulator 32, an optional diffusion barrier 34, e.g. TiN, a lower electrode 36, e.g. Ru, Pt or $RuO_2$, a high-k dielectric film 38, e.g. barium strontium titanate (BST) and an upper electrode 40, e.g. Ru or Pt.

Figure 3:
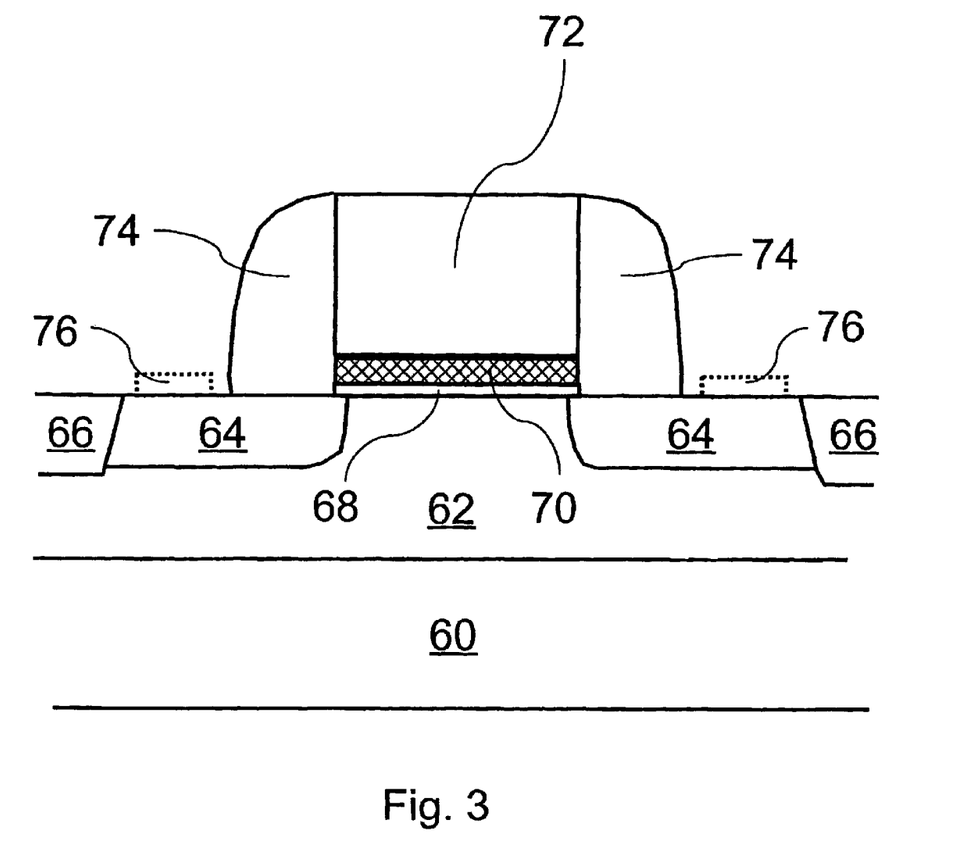
FIG. 3 is a schematic view of an NMOS transistor suitable for CMOS structures.

The partial transistor structure shown in FIG. 3 consists of a substrate 60, an n-type well 62, a p-type diffusion region 64 (right drain, left source), a shallow trench isolation oxide 66, a gate dielectric 68, an optional barrier layer 70, a gate metal 72, a gate isolation spacers 74 and contact areas for tungsten plugs 76. The contact areas are dotted because they are not in the same vertical plane with the other numbered parts. A CMOS structure contains both PMOS and NMOS transistors. The contact areas against P-type semiconductor can be made of e.g. Ni and RuO. The contact areas against N-type semiconductor can be made of, e.g., Ru. Platinum can also be applied under W plugs. The choice of the metal or electrically conductive metal compound depends on the work function of the underlying layer and the reactivity of the surrounding materials with the said metal or electrically conductive metal compound.

Figure 4:
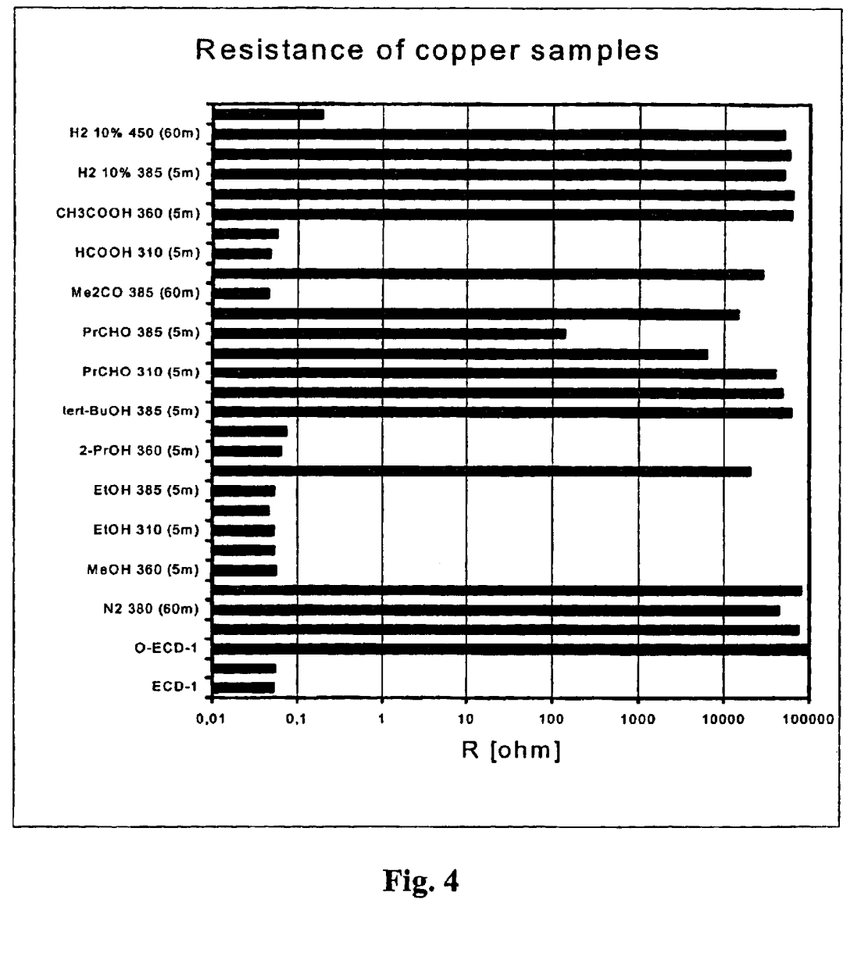
FIG. 4 depicts the electrical resistance of reduced copper samples.

FIG. 4 shows the resistance values of reduced copper samples. The values are the average of 10 measurements from each sample. ECD stands for copper metal deposited on silicon. ECD-1 and ECD-2 indicates pure ECD copper metals without any additional treatments. O-ECD-1 and O-ECD-2 indicates samples that have a copper oxide coating (about 350 nm). The rest of the samples had a copper oxide coating before the reduction experiments. $N_2$ is nitrogen gas with a claimed purity of 99.9999%, MeOH is methanol, EtOH is ethanol, 2-PrOH is isopropanol, tert-BuOH is tert-butanol, PrCHO is butyraldehyde, $Me_2CO$ is acetone, HCOOH is formic acid, $CH_3COOH$ is acetic acid, and $H_2$ is hydrogen. The number after the reagent name is the reaction temperature in degrees C. The number in parentheses is the reaction time in minutes.

DETAILED DESCRIPTION OF THE PREFERRED EMBODIMENT

A layer of a low volatility oxide of a metal is grown on a substrate. Preferably the metal oxide is grown on the substrate according to the principles of an ALD process, and the following disclosure is directed to this embodiment. However, the skilled artisan will recognize that other methods of depositing a metal oxide thin film may be used in the methods of the invention. After the ALD process, the thin film consists essentially of a metal oxide or a mixture of metal oxides. The metal oxides are at least partially converted into a metal in a separate process step to increase the conductivity of the deposited oxide thin film. The conversion step can be done with any reducing agent capable of forming a stronger bond to oxygen than the metal to be reduced. Preferably, the reducing agent is in the gaseous phase. However, in the case of silver and gold oxides, the conversion step can be done simply by heating to decompose the oxide into metal and oxygen.

The following low volatility metal oxides and mixtures and nanolaminates of the following metal oxides are examples of compounds that are suitable for conversion into a conductive form by the method of the present invention: $ReO_2$, $Re_2O_5$, $ReO_3$, $RuO_2$, $OsO_2$, $CoO$, $Co_3O_4$, $Rh_2O_3$, $RhO_2$, $IrO_2$, $NiO$, $PdO$, $PtO_2$, $Cu_2O$, $CuO$, $Ag_2O$ (dec. 230° C.), $Au_2O_3$ (dec. 160° C.). However, a person skilled in the art will understand that the present invention is not limited to these metal oxides, in part because the stoichiometry may vary in metal oxide films. In addition, the following high-volatility metal oxides exist: $Re_2O_7$, $RuO_4$ and $OsO_4$.

A metal oxide layer is preferably produced by the ALD process. A typical ALD process comprises the following steps:

1. placing a substrate into a reaction chamber;
2. feeding into the reaction chamber and contacting the substrate with a pulse of at least one first source chemical, preferably in the vapor phase, comprising a compound capable of adsorbing no more than a monolayer of metal species on the substrate;
3. removing gases from the chamber;
4. feeding into the reaction chamber and contacting the substrate with a pulse of at least one second source chemical, preferably in the vapor phase, comprising a compound capable of oxidizing the metal species on the substrate into a metal oxide, and 4. removing gases from the chamber; and
5. repeating steps 2 through 4 until a desired thickness of the growing thin film is reached.

According to the ALD principles, the reaction chamber is purged from the previous reactant (i.e. previously pulsed source chemical) and the gaseous by-products of the surface reaction before next pulse of a reactant is introduce into the reaction chamber. The reaction chamber can be purged either by evacuating the chamber into a higher vacuum by a vacuum pump or by purging the chamber with an inert gas pulse.

In the methods of the present invention, the ALD cycle described above is preferably repeated at least 3 times, more preferably at least 10 times. A metal oxide thin film of at least one nm is preferably formed on the substrate.

"Metal species" in the context of the present application means a separate molecule, atom or ion comprising one or more metal atoms.

According to first preferred embodiment of the present invention a substrate with open trenches and vias is provided into an ALD reaction chamber. A diffusion barrier layer 14 is on the surfaces of the substrate. The pressure of the reaction chamber is adjusted to about 5–10 mbar with a vacuum pump and flowing nitrogen gas. A metal oxide thin film is grown on the diffusion barrier 14 from alternate pulses of a metal source chemical and oxygen source chemical. Surplus source chemical and reaction by-products are essentially removed from the reaction chamber after each source chemical pulse before the next source chemical pulse is introduced into the reaction chamber and contacted with the substrate surface. The pulsing cycle is repeated until the thickness of the metal oxide film is sufficient for seed layer purposes. The metal oxide film is reduced into a metal layer and used as a seed layer 16 for an electroplating process.

According to a second preferred embodiment of the present invention a substrate is provided into a reaction chamber of an ALD reactor. The substrate is heated to a deposition temperature of selected metal oxide. Alternate gas phase pulses of a metal source chemical and an oxygen source chemical are introduced into the reaction chamber and contacted with the substrate surface. A metal oxide film is grown on the surface. The metal oxide is used as the first electrode 36 of a capacitor or converted into corresponding metal and used as the first electrode 36 of the capacitor. Then a thin film of a high-k dielectric material 38 is grown on the first electrode 36. The high-k layer 38 is optionally annealed. A metal oxide thin film is grown by ALD on the high-k layer. The metal oxide film is converted into corresponding metal and used as the second electrode 40 of a capacitor. However, the metal oxide thin film can be used as the second electrode of the capacitor if the conductivity of the metal oxide thin film is sufficiently high as such for the purpose.

According to third preferred embodiment of the present invention a substrate is provided into a reaction chamber of an ALD reactor. The surface may be, for example, a transistor gate oxide 68 or doped silicon on source and drain areas 64. The substrate is heated to a deposition temperature. Alternate gas phase pulses of a metal source chemical and an oxygen source chemical are introduced into the reaction chamber and contacted with the substrate surface. Metal oxide film is grown on the surface. The metal oxide is used as the gate electrode of a transistor as such or converted into the corresponding metal and used as the gate electrode of a transistor. The metal is also used as an intermediate layer 76 between silicon and tungsten plugs on the source and the drain areas of the transistor.

According to one embodiment of the present invention the metal oxide is ruthenium oxide and one deposition cycle of ruthenium oxide consists of a ruthenium halide pulse, nitrogen purge, a pulse of a reducing agent, nitrogen purge, an oxygen source pulse and nitrogen purge. It is known that $RuF_6$ and $RuF_5$ can be reduced with iodine into $RuF_4$ (N. N. Greenwood and A. Earnshaw in "Chemistry of the Elements", Pergamon Press, 1984, p. 1258). When, e.g., $RuF_5$ chemisorbs on a surface, Ru should release at least one F and form a bond to the surface. Equation (III) illustrates the reaction.

$$RuF_5(g) + \text{—OH(ads.)} \rightarrow \text{—O—}RuF_4(ads.) + HF(g) \quad \text{(III)}$$

The oxidation state of Ru in $RuF_5$ is +5, which is too high for the formation of $RuO_2$. According to one embodiment of the present invention, Ru(V) compound that is adsorbed on a surface is reduced into Ru(IV) compound with gaseous iodine. After the reduction process the oxidation state of ruthenium in the adsorbed Ru compound is +4 and results in the growth of $RuO_2$ when a pulse of oxygen source chemical is introduced into the reactor and contacts the surface of the substrate. Equations (IV) and (V) illustrates the reactions:

$$10(\text{—}RuF_4)(ads.) + I_2(g) \rightarrow 10(\text{—}RuF_3)(ads.) + 2IF_5(g) \quad \text{(IV)}$$

When an oxygen source chemical is contacted with the surface a reaction according to equation (V) takes place:

$$2(\text{—}RuF_3)(ads.) + 4H_2O(g) \rightarrow 2[\text{—}RuO(\text{—}OH)](ads.) + 6HF(g) \quad \text{(V)}$$

Due to equal oxidation states of Ru in the adsorbed Ru source compound and Ru in the resulting ruthenium oxide, the removal of F ligands from the surface in the form of gaseous HF molecules is a straightforward procedure.

According to one embodiment of the present invention the metal oxide thin film deposited by ALD consists of metallic ruthenium and ruthenium oxide. The growth of the ruthenium-rich film is based on reduction-oxidation (redox) reactions on the surface.

Known oxides of ruthenium are $RuO_2$ and $RuO_4$. The vapor pressure of $RuO_2$ is negligible at the reactor temperatures used according to the present invention. However, $RuO_4$ has such a high vapor pressure, 760 torr at 40° C., that it can easily be evaporated from an external source.

One deposition cycle for the growth of ruthenium-rich thin film consists of a $RuO_4$ pulse, a nitrogen purge, a pulse of vaporized organic reducing agent, and a nitrogen purge. Therefore, in the beginning of the growth process ruthenium tetra-oxide ($RuO_4$) is adsorbed on the substrate surface. Adsorbed ruthenium oxide is reduced to metallic ruthenium with an organic reducing agent, ruthenium tetra-oxide is contacted again with the surface of the substrate when $RuO_2$ is formed and then $RuO_2$ is at least partly reduced with an organic reducing agent to metallic ruthenium.

Ruthenium metal is in the oxidation state of 0, while ruthenium has an oxidation state of VIII in $RuO_4$. On the substrate surface there is ruthenium with low oxidation state. High oxidation state ruthenium source chemical is contacted with the surface. A redox reaction according to equation (VI) takes place on the substrate surface:

$$Ru(ads.) + RuO_4(g) \rightarrow 2RuO_2(ads.) \quad \text{(VI)}$$

In addition, one molecular layer of $RuO_4$ may adsorb on the low-volatility $RuO_2$ surface.

Then the surface is treated with a reducing agent pulse:

$$RuO_2(ads.) + 2CH_3CH_2OH \rightarrow Ru(ads.) + 2CH_3CHO(g) + 2H_2O(g) \quad \text{(VII)}$$

Suitable reducing agents include alcohols, aldehydes, carboxylic acids and hydrogen radicals.

Ruthenium metal thin film and/or ruthenium oxide thin film produced thereof can be used as a seed layer and/or an electrode.

Deposition of ternary ruthenium compounds is also possible. For example, $SrRuO_3$, which is suitable electrode material, is grown by ALD by applying alternate source chemical pulses of a Sr compound, Ru compound and oxygen compound.

According to one embodiment of the present invention, $OsO_4$ is prepared in situ with a highly reactive oxygen compound from low volatility Os metal or osmium oxides such as $OsO_2$. $OsO_4$ requires careful handling due to its high toxicity and volatility (760 torr 130° C.). A low-volatility Os source is placed in a zone in front of the substrate space. The source is heated to about 130–150° C. Then, e.g., ozone is pulsed over Os.

$$Os(s)+4O_3(s) \rightarrow OsO_4(g)+4O_2(g) \qquad (VII)$$

Surplus $O_3$ gas is decomposed into $O_2$ before the reaction chamber to protect the $OsO_2$ layer which is growing on the substrate surface. $O_3$ is easily decomposed by heating or with molecular sieves such as zeolites.

When depositing silver and gold oxides by ALD, special attention has to paid to the selection of growth temperatures, since $Ag_2O$ decomposes into Ag and $O_2$ at 230° C. and $Au_2O_3$ decomposes into Au and $O_2$ at 160° C. Therefore, the deposition temperature of silver oxide must be kept below 230° C. and the deposition temperature of gold oxide is thus below 160° C.

The Source Chemicals

The ALD source chemicals must have sufficient volatility at the source temperature. The vapor pressure of the source chemical should be at least about 0.02 mbar at the source temperature to enable reasonably short pulse times for saturating the substrate surfaces. The metal source chemicals must be thermally stable at the deposition temperature to prevent particle formation in the gas-phase of the reaction chamber.

Suitable metal source compounds are sold, for example, by Strem Chemicals, Inc. (7 Mulliken Way, Dexter Industrial Park, Newburyport, Mass., USA) and Tri Chemical Laboratory, Inc. (969 Helena Drive, Sunnyvale, Calif., USA).

Low oxidation state rhenium oxide can be grown by ALD from following rhenium compounds: rhenium(VII)oxide ($Re_2O_7$), rhenium pentacarbonyl chloride ($Re(CO)_5Cl$), methyltrioxorhenium(VII) ($CH_3ReO_3$), cyclopentadienylrhenium tricarbonyl (($C_5H_5)Re(CO)_3$), pentamethylcyclopentadienylrhenium tricarbonyl ($[(CH_3)_5C_5]Re(CO)_3$), and i-propylcyclopentadienylrhenium tricarbonyl (($C_3H_7)C_5H_4Re(CO)_3$).

Low oxidation state ruthenium oxide can be grown by ALD from following ruthenium compounds: ruthenium(VIII)oxide ($RuO_4$), bis(cyclopentadienyl) ruthenium (($C_5H_5)_2Ru$), bis(pentamethylcyclopentadienyl) ruthenium ($[(CH_3)_5C_5]_2Ru$), cyclopentadienylruthenium dicarbonyl (($C_5H_5)_2Ru(CO)_2$), bis(2,2,6,6-tetramethyl-3,5-heptanedionato)(1,5-cyclooctadiene)ruthenium(II) ($C_{11}H_{19}O_2)_2(C_8H_{12})Ru$, tris(dipivaloylmethanato) ruthenium i.e. tris(2,2,6,6-tetramethyl-3,5-heptanedionato) ruthenium ($Ru(DPM)_3$ or $Ru(thd)_3$), anhydrous ruthenium-nitrate ($Ru(NO_3)_3$), and anhydrous ruthenium (III) nitrosyl nitrate ($Ru(NO)(NO_3)_3$).

Low oxidation state osmium oxide is preferably grown by ALD from following osmium compounds: bis(cyclopentadienyl)osmium (($C_5H_5)_2Os$), bis (pentamethylcyclopentadienyl)osmium ($[(CH_3)_5C_5]_2Os$), and osmium(VIII)oxide ($OsO_4$).

Cobalt oxide is preferably grown by ALD from following cobalt compounds: bis(cyclopentadienyl)cobalt(II) (($C_5H_5)_2Co$), bis (methylcyclopentadienyl)cobalt(II) (($CH_3C_5H_4)_2Co$), bis (pentamethylcyclopentadienyl)cobalt(II) ($[(CH)_3C_5]_2Co$), cobalt tricarbonyl nitrosyl ($Co(CO)_3NO$), cyclopentadienyl-cobalt dicarbonyl $C_5H_5Co(CO)_2$, cobalt(III)acetylacetonate ($Co(CH_3COCHCOCH_3)_3$), tris(2,2,6,6-tetramethyl-3,5-heptanedionato)cobalt(III) i.e. tris(dipivaloylmethanato) cobalt ($Co(TMHD)_3$, or $Co(DPM)_3$, or $Co(thd)_3$, or $Co(C_{11}H_{19}O_2)_3$), and anhydrous cobalt nitrate ($Co(NO_3)_3$), the synthesis of which has been described by R. J. Logan et al. in J. Chem. Soc., Chem. Commun. (1968) 271.

Rhodium oxide is preferably grown by ALD from following rhodium compounds: 2,4-pentanedionatorhodium(I)dicarbonyl ($C_5H_7Rh(CO)_2$), tris(2,4-pentanedionato)rhodium rhodium(III) acetylacetonate ($Rh(C_5H_7O_2)_3$), and tris(trifluoro-2,4-pentanedionato)rhodium.

Iridium oxide is preferably grown by ALD form following iridium compounds: (methylcyclopentadienyl)(1,5-cyclooctadiene)iridium(I) ($[(CH_3)CH_4](C_8H_{12})Ir$) and trisallyliridium (($C_3H_5)_3Ir$).

Nickel oxide is preferably grown by ALD from following nickel compounds: nickel carbonyl ($Ni(CO)_4$), bis(2,2,6,6-tetramethyl-3,5-heptanedionato)nickel(II) ($Ni(DPM)_2$, or $Ni(thd)_2$, or $Ni(C_{11}H_{19}O_2)_2$), nickel(II)acetylacetonate, also known as bis(2,4-pentanedionato)nickel(II), nickel(II) trifluoroacetylacetonate, nickel(II) hexafluoroacetylacetonate ($Ni(CF_3COCHCOCF_3)_2$), nickel (II)dimethylglyoxime ($Ni(HC_4H_6N_2O_2)_2$), and tetrakis (trifluorophosphine)nickel(0) ($Ni(PF_3)_4$).

Palladium oxide is preferably grown by ALD from following palladium compounds: bis(1,1,1,5,5,5-hexafluoro-2,4-pentanedionato)palladium ($Pd(CF_3COCHCOCF_3)_2$) and $Pd(thd)_2$.

Platinum oxide is preferably grown by ALD from following platinum compounds: platinum(II)hexafluoroacetylacetonate (Pt $(CF_3COCHCOCF_3)_2$), (trimethyl) methylcyclopentadienylplatinum(IV) (($CH_3)_3(CH_3C_5H_4)$ Pt), and allylcyclopentadienylplatinum (($C_3H_5)(C_5H_5)Pt$).

Copper oxide is preferably grown by ALD from following copper compounds: CuCl, CuBr, CuI, bis(6,6,7,7,8,8,8-heptafluoro-2,2-dimethyl-3,5-octanedionato)copper(II) ($Cu(FOD)_2$), bis(2,2,6,6-tetramethyl-3,5-heptanedionato)copper(II) (Cu $(TMHD)_2$, or $Cu(DPM)_2$, or $Cu(thd)_2$), copper(II) acetylacetonate ($Cu(CH_3COCHCOCH_3)_2$), copper(II) trifluoroacetylacetonate ($Cu(CF_3COCHCOCH_3)_2$), copper (II)hexafluoroacetylacetonate ($Cu(CF_3COCHCOCF_3)_2$), hexafluoroacetylacetonatocopper(I)trimethylphosphine adduct ($Cu(CF_3COCHCOCF_3)P(CH_3)_3$), cyclopentadienylcopper(I)triethylphosphine (($C_5H_5)Cu:P(C_2H_5)_3$), ethylcyclopentadienylcopper triphenylphosphine adduct (($C_2H_5C_5H_4)Cu:P(C_6H_5)_3$), hexafluoroacetylacetonatocopper(I)triethylphosphine adduct (($C_5HF_6O_2)Cu:P(C_2H_5)_3$), hexafluoroacetylacetonatocopper(I)2-butyne adduct (($C_5HF_6O_2)Cu:CH_3C \equiv CCH_3$), hexafluoroacetylacetonatocopper(I)1,5-cyclooctadiene adduct (($C_5HF_6O_2)Cu:C_8H_{12}$), hexafluoropentanedionatocopper(I)vinyltrimethylsilane adduct, and anhydrous copper nitrate (Cu(NO$_3$)$_2$), the synthesis of which has been described by C. C. Addison et al. (J. Chem. Soc. (1958) pp. 3099–3106).

Silver oxide is preferably grown by ALD from hexafluoroacetylacetonatosilver trimethylphosphine adduct ((C$_5$HF$_6$O$_2$)Ag:P(CH$_3$)$_3$).

Gold oxide is preferably grown by ALD from following gold compounds:
gold(III)fluoride AuF$_3$, dimethyl(acetylacetonato)gold(III) ((CH$_3$)$_2$(C$_5$H$_7$O$_2$)Au), and dimethylhexafluoroacetylacetonatogold ((CH$_3$)$_2$Au(C$_5$HF$_6$O$_2$)).

The oxygen source material used in the method of the present invention is selected from a group of volatile or gaseous compounds that contain oxygen and are capable of reacting with an adsorbed metal compound on the substrate surface, at the deposition conditions, resulting in growth of metal oxide thin film on the substrate surface.

It is to be noted that Re, Ru and Os form highly volatile oxides when reacting with strong oxidizing agents. It is therefore necessary to exclude strong oxidizing agents from the vicinity of the substrate when growing lower oxidation state oxides of Re, Ru and Os.

In the production of a metal oxide thin film on a wafer the oxygen source chemical is selected from a group consisting of water (H$_2$O), hydrogen peroxide (H$_2$O$_2$), oxygen (O$_2$), ozone (O$_3$), and oxygen compounds with unpaired electrons, as well as oxygen radicals and —OH radicals.

A special group of oxygen source chemicals can be used when the metal source chemical is an anhydrous metal nitrate. This group of oxygen chemicals consists of an aqueous solution of ammonia (NH$_3$*H$_2$O or NH$_4$OH), an aqueous solution of hydroxylamine (NH$_2$OH*H$_2$O), and an aqueous solution of hydrazine (N$_2$H$_4$*H$_2$O).

Mixtures of at least two oxygen source chemicals can also be used for metal oxide deposition. Especially in case of ozone, the substrate surface may remain too "dry" (i.e. the surface contains too few —OH groups) and the number of active surface sites (especially —OH groups) will drop below an optimum value. By adding certain amount of water vapor to the ozone pulse, the number of —OH groups on the surface can be increased and the growth rate of the metal oxide thin film can be improved. Also water vapor can be pulsed after the O$_3$ pulse to achieve the same result as with the water-ozone pulse.

Reduction Process

The method of reducing the metal oxide layer plays a very important role in the present invention. The metal oxide is reduced by means of volatile organic reducing agents, such as organic compounds that contain at least one —OH, —CHO and/or —COOH functional group or gaseous mixtures of said organic compounds. Surprisingly, good adhesion of the reduced metal oxide thin film is preserved when the above mentioned organic reducing agents are used. In comparison, the use of very strong reducing agents, such as hydrogen plasma, results in very poor adhesion of the reduced films.

According to one aspect of the present invention the metal oxide thin film that is to be reduced into a metal thin film consists essentially of a metal oxide or a mixture of metal oxides. The conversion step is preferably done with a reducing agent capable of forming a stronger bond to the oxygen of the metal oxide layer than the metal in the said oxide layer. Preferably the reducing agent is in gaseous form. The gaseous reducing agent is capable of taking away the oxygen that was bound to the metal oxide and thus an elemental metal is left on the substrate surface. For example, primary alcohols react into aldehydes and a water molecule is released as a byproduct. Aldehydes take one oxygen atom and react into carboxylic acids, without the formation of a water molecule.

According to one embodiment of the present invention, reducing agents that comprise relatively bulky molecules (alcohols, aldehydes and carboxylic acids) are used. Bulky source chemical molecules do not easily diffuse inside the metal oxide film. Thus the reduction reaction takes place only at the surface of the metal oxide layer. During the reduction process, oxygen ions diffuse towards the surface where oxygen is depleted by the reducing chemicals. Gaseous by-products are thus not formed inside the film, but only on the surface. The structural integrity of the forming metal film is thereby preserved and the formation of pinholes on the film will be avoided.

The reduction process is preferably carried out in a reaction space that enables controlled temperature, pressure and gas flow conditions. The organic reducing agent is preferably vaporized and fed to the reaction space, optionally with the aid of an inert carrier gas, such as nitrogen. The reducing agent is contacted with the substrate, whereby the metal oxide layer is reduced at least partly to metal and the reducing agent is oxidized. Typically, the reaction space is then purged with an inert carrier gas to remove the unreacted organic reducing agent and reaction products.

The reduction process according to the present invention is preferably carried out at low temperatures. Theoretically, the reactions between oxide(s) and the reducing agents used in the process of the present invention are favorable in a wide temperature range, even as low as room temperature. Kinetic factors and the diffusion rate of oxygen to the thin film surface set a lower limit on the actual process temperatures that can be applied successfully. The temperature in the reaction space is preferably in the range of 200 to 400° C., more preferably 300 to 400° C. and even more preferably 310 to 390° C. It is to be noted that in case of very thin metal oxide films, the reduction temperature can be even lower than 250° C. If the deposition and reduction temperature must be very low, thus causing a slow reduction reaction or slow diffusion of oxygen through the metal oxide layer, the deposition of the metal film can be divided into at least two parts to speed up the total processing time. One layer of the metal oxide, preferably comprising more than one monolayer, is deposited by ALD, then reduced into a metal layer, another layer, preferably comprising more than one monolayer of the metal oxide, is deposited by ALD, then reduced into a metal layer, et cetera, until a metal film of desired thickness is obtained.

The pressure in the reaction space is preferably 0.01 to 20 mbar, more preferably 1 to 10 mbar.

The processing time varies according to the thickness of the layer to be reduced. A layer of copper oxide having a thickness up to 300–400 nm can be reduced in approximately 3 to 5 minutes. For layers having a thickness of approximately 0.1–10 nm, the processing time is in the order of seconds. Preferably the layer to be reduced has a thickness of at least 1 nm.

The organic compounds used in the reduction according to the present invention preferably have at least one functional group selected from the group consisting of alcohol (—OH), aldehyde (—CHO), and carboxylic acid (—COOH).

Suitable reducing agents containing at least one alcohol group are preferably selected from the group consisting of:
primary alcohols which have an —OH group attached to a CH$_3$ group (CH$_3$OH) or to a carbon atom which is bonded to one other carbon atom, in particular primary alcohols according to the general formula (I)

$$R^1\text{—OH} \tag{I}$$

wherein $R^1$ is a linear or branched $C_1$–$C_{20}$ alkyl or alkenyl group, preferably methyl, ethyl, propyl, butyl, pentyl or hexyl, examples of preferred primary alcohols being methanol ($CH_3OH$), ethanol ($CH_3CH_2OH$), propanol ($CH_3CH_2CH_2OH$), butanol ($CH_3CH_2CH_2CH_2OH$), 2-methyl propanol (($CH_3)_2CHCH_2OH$) and 2-methyl butanol ($CH_3CH_2CH(CH_3)CH_2OH$), secondary alcohols which have an —OH group attached to a carbon atom which is bonded to two other carbon atoms, in particular secondary alcohols according to formula (II)

$$\tag{II}$$

wherein each $R^1$ is selected independently from the group of linear or branched $C_1$–$C_{20}$ alkyl and alkenyl groups, preferably methyl, ethyl, propyl, butyl, pentyl and hexyl, examples of suitable secondary alcohols being 2-propanol (($CH_3)_2CHOH$) and 2-butanol ($CH_3CH(OH)CH_2CH_3$), tertiary alcohols which have an —OH group attached to a carbon atom which is bonded to three other carbon atoms, in particular tertiary alcohols according to the general formula (III)

$$\tag{III}$$

wherein each $R^1$ is selected independently from the group of linear or branched $C_1$–$C_{20}$ alkyl and alkenyl groups, preferably methyl, ethyl, propyl, butyl, pentyl and hexyl, an example of suitable tertiary alcohol being tert-butanol (($CH_3)_3COH$), polyhydroxy alcohols, such as diols and triols, which can have primary, secondary and/or tertiary alcohol groups as presented above, for example ethylene glycol ($HOC_2CH_2OH$) and glycerol ($HOCH_2CH(OH)CH_2OH$), cyclic alcohols which have an —OH group attached to at least one carbon atom which is part of a ring of 1–10, typically 5–6 carbon atoms, aromatic alcohols having at least one —OH group attached either to the benzene ring or to a carbon atom in a side-chain, such as benzyl alcohol ($C_6H_5CH_2OH$), o-, p- and m-cresol and resorcinol, halogenated alcohols, preferably having the general formula (IV)

$$CH_nX_{3-n}\text{—}R^2\text{—OH} \tag{IV}$$

wherein X is F, Cl, Br or I, preferably F or Cl,
n is an integer from 0 to 2, and
$R^2$ is selected from the group of linear or branched $C_1$–$C_{20}$ alkylene and alkenylene groups, preferably methylene, ethylene, trimethylene, tetramethylene, pentamethylene and hexamethylene, and in particular methylene and ethylene, an example of a suitable compound is 2,2,2-trifluoroethanol ($CF_3CH_2OH$), and other derivatives of alcohols, for example amines, such as methyl ethanolamine ($CH_3NHCH_2CH_2OH$).

Suitable reducing agents containing at least one —CHO group are preferably selected from the group consisting of compounds having the general formula (V)

$$R^3\text{—CHO} \tag{V}$$

wherein $R^3$ is hydrogen or linear or branched $C_1$–$C_{20}$ alkyl or alkenyl group, preferably methyl, ethyl, propyl, butyl, pentyl or hexyl, in particular methyl or ethyl, examples of suitable compounds according to formula (V) are formaldehyde (HCHO), asetaldehyde ($CH_3CHO$) and butyraldehyde ($CH_3CH_2CH_2HO$), alkanedial compounds having the general formula (VI)

$$OHC\text{—}R^4\text{—CHO} \tag{VI}$$

wherein $R^4$ is a linear or branched $C_1$–$C_{20}$ saturated or unsaturated hydrocarbon, but it is also possible that $R^4$ is zero, i.e., the aldehyde groups are bonded to each other, halogenated aldehydes, and
other derivatives of aldehydes.

Suitable reducing agents containing at least one —COOH group are preferably selected from the group consisting of compounds having the general formula (VII)

$$R^5\text{—COOH} \tag{VII}$$

wherein $R^5$ is hydrogen or linear or branched $C_1$–$C_{20}$ alkyl or alkenyl group, preferably methyl, ethyl, propyl, butyl, pentyl or hexyl, in particular methyl or ethyl, examples of suitable compounds according to formula (VI) being formic acid (HCOOH) and acetic acid ($CH_3COOH$), polycarboxylic acids,
halogenated carboxylic acids, and
other derivatives of carboxylic acids.

Reactors used for deposition of thin films by ALD and/or CVD are preferably used in the methods of the present invention. However, the deposition of the metal oxide thin film and the reduction step are preferably carried out sequentially in one reactor. The reduction process can also be done in a cluster tool where the substrate arrives from a previous process step, the substrate is treated with the reducing agent and finally transported to the following process step. In a cluster tool the reaction space temperature can be kept constant, which improves the throughput when compared to a reactor which is heated to the process temperature before each run.

EXAMPLE 1

ALD of Copper Oxide, Method I

The deposition was carried out in an F-200 ALCVD™ reactor manufactured by ASM Microchemistry Oy, Finland. Cu(thd)$_2$ was loaded into an external source container and heated to 180° C. The flow of the $O_3/O_2$ mixture was set to 120 std.cm$^3$/min. There was about 15% of $O_3$ in $O_2$. A 200 mm silicon wafer was loaded through a load lock into the reaction chamber of the reactor. The pressure of the reaction chamber was adjusted to about 5–10 mbar with a vacuum pump and flowing nitrogen gas. The reaction chamber was then heated to 210° C. One pulsing cycle consisted of 0.5 s $Cu(thd)_2$ pulse, 1.0 s $N_2$ purge, 0.5 s $O_3$ pulse and 1.0 s $N_2$ purge. The pulsing cycle was repeated 3000 times. The thin film grown on the wafer had a brownish gray color, high resistivity and excellent adhesion. The thin film consisted of CuO, which was treated with an organic reducing agent to create a metallic copper metal film on the wafer. The reduced thin film had good conductivity and showed excellent adhesion to the substrate.

EXAMPLE 2

ALD of Copper Oxide, Method II

The deposition of copper oxide was carried out according to Example 1, with CuCl used as the copper source chemical. Pieces of silicon substrates with and without a TiN coating were loaded into the reaction chamber of the reactor. CuCl was loaded into a source tube and the reactor was evacuated. The pressure of the reaction chamber was adjusted to about 3–10 mbar with a vacuum pump and flowing $N_2$ gas. The reaction chamber was heated to 380° C. and CuCl to about 360° C. Copper oxide grew in a controlled manner and with excellent adhesion to both of the substrates and had the same performance as the CuO film obtained in Example 1.

EXAMPLE 3

ALD of Copper Oxide, Method III

Surprisingly, it was found that copper oxide ($Cu_2O$) can be grown by ALD using anhydrous copper nitrate $Cu(NO_3)_2$ and an aqueous solution of $NH_3$ as source chemicals. It turned out that gaseous ammonia does not form $Cu_2O$ with anhydrous copper nitrate.

$Cu(NO_3)_2$ was synthesized according to the instructions of C. C. Addison et al. (J. Chem. Soc. (1958) pp. 3099–3106). Wet $NH_3$ vapour was formed by evaporating aqueous solution of $NH_3$ at room temperature from an external source bottle. The temperature of the $Cu(NO_3)_2$ source tube was set to 120° C. Silicon and TiN-coated silicon were used as substrates. The substrate temperature was about 150° C. Higher substrate temperatures were also tested. However, it was found that it is difficult to control the film uniformity at higher growth temperatures, possibly because of the thermal decomposition of copper nitrate in gas phase.

One pulsing cycle consisted of four steps, in the following order: $Cu(NO_3)_2$ pulse (1.0 s), $N_2$ purge (2.0 s), $NH_3*H_2O$ pulse (2.0 s), $N_2$ purge (2.0 s).

The thin film grown at 150° C. on the substrate had a growth rate of 0.2 Å/cycle and according to EDS measurements consisted of $Cu_2O$.

EXAMPLE 4

ALD of Cobalt Oxide $Co(thd)_3$ and $O_3$ were used as source chemicals for the cobalt oxide deposition. $Co(thd)_3$ was heated to 110° C. $O_3$ was prepared from 99.9999% $O_2$ with an external ozone generator. The resulting oxygen source gas mixture consisted of 10–20 vol.-% $O_3$ in $O_2$ Nitrogen, evaporated from liquid nitrogen, was used as an inert purging gas. $Co(thd)_3$ pulse length varied from 1.5 s to 2.0 s, while $O_3$ pulse (flow rate 100 std.cm³/min) length varied from 2.0 s to 4.0 s. Silicon was used as the substrate material. Substrate temperatures between 150° C. and 350° C. were tested. One pulsing cycle consisted of four sequential steps: $Co(thd)_3$ pulse, $N_2$ purge, $O_3$ pulse, $N_2$ purge.

The higher deposition temperature tested resulted in uncontrolled film growth, as $Co(thd)_3$ decomposed thermally thus producing a poor thickness profile for the thin film. At the lower substrate temperatures, a controlled growth rate of the thin film (0.3 Å/cycle) and good adhesion were obtained. A total of 2000 pulsing cycles resulted in a 64 nm thick cobalt oxide layer. According to Energy Dispersive X-ray Spectroscopy (EDS) measurements the thin films consisted of CoO.

EXAMPLE 5

ALD of Palladium Oxide

Substrates with Si, TiN, WN, $W_3C$ and $SiO_2$ surfaces were loaded into an F-120 ALCVD™ reactor manufactured by ASM Microchemistry Ltd., Finland. $Pd(thd)_3$ was loaded to a solid source tube of the reactor. The reactor was pumped to vacuum. The pressure of the reaction chamber was adjusted to about 5–10 mbar with flowing nitrogen gas while the pumping of the reactor continued. The $Pd(thd)_3$ was heated to 110° C. and the reaction chamber to 150° C.

One pulsing cycle consisted of four steps in the following order: $Pd(thd)_3$ pulse (2.0 s), $N_2$ purge (1.0 s), $O_3$ pulse (4.0 s), $N_2$ purge (2.0 s).

The growth rate of palladium oxide from $Pd(thd)_3$ and $O_3$ was 0.15 Å/cycle at 150° C. According to EDS the film consisted of palladium oxide. The film grew on Si, TiN, WN, $W_3C$ and $SiO_2$ surfaces and showed good adhesion.

EXAMPLE 6

ALD of Ruthenium Oxide

Ruthenium oxide was grown from alternate pulses of bis(ethylcyclopentadienyl)ruthenium $(EtCp)_2Ru$ and water. The $(EtCp)_2Ru$ source container was heated to about 90–95° C. Evaporated $(EtCp)_2Ru$ was introduced into the reaction chamber, which was heated close to 200° C., and contacted with the substrate surface for 1.0 s. The reaction chamber was purged with inert nitrogen gas for 0.5 s to remove residual $(EtCp)_2Ru$ from the gas phase. After that, water vapor, which was evaporated from an external source bottle, was introduced into the reaction chamber and contacted for 2.0 s with the substrate surface, where $H_2O$ molecules reacted with adsorbed Ru compound molecules. Then the reaction chamber was purged with inert nitrogen gas to remove residual $H_2O$ and reaction by-products. The set of pulses was repeated until a ruthenium oxide thin film with the desired thickness was grown on the substrate. Optionally some amount of oxygen gas may be added to the $H_2O$ flow to control the oxidation state of Ru. Relatively mild oxidizing agents were used. Strong oxidizing agents, e.g. ozone, have a tendency to oxidize part of the adsorbed ruthenium into its maximum oxidation state +8 and the resulting $RuO_4$ is highly volatile and thus the growth of $RuO_2$ is disturbed because of desorbing $RuO_4$.

EXAMPLE 7

Reduction of Copper Oxide

Oxidized ECD copper oxide samples covered with around 350 nm of a copper oxide layer were reduced in an ALD reactor. Several organic compounds were tested as reducing agents. Resistance of non-oxidized ECD copper samples, oxidized ECD samples and reduced ECD copper oxide samples were measured. ECD copper metal samples consisted of pure metal deposited on silicon substrate.

Nitrogen gas ($N_2$) of a purity of 99.9999% was used as a carrier gas for the reducing agents. Tested reducing agent were MeOH (methanol), EtOH (ethanol), 2-PrOH (isopropanol), tert-BuOH (tert-butanol), PrCHO (butyraldehyde), $Me_2CO$ (acetone), HCOOH (formic acid), $CH_3COOH$ (acetic acid), and $H_2$ (hydrogen, for a comparison).

The effect of different reducing temperatures is shown in FIG. 4, where the number after the reducing agent is the reduction temperature in degree C. Also, different reaction times were tested. The reaction time in minutes is given in parenthesis.

In FIG. 4 ECD-1 and ECD-2 stands for pure ECD copper metals without any additional treatments. O-ECD-1 and O-ECD-2 indicates samples that have a copper oxide coating (about 350 nm). The resistance values in R (ohm) measured from the samples after the reduction step are averages of 10 measurements.

What is claimed is:

1. A method of producing a conductive thin film, comprising:
   depositing a metal oxide thin film on a substrate by an atomic layer deposition (ALD) process; and
   at least partially reducing said metal oxide thin film with one or more organic compounds.

2. The method of claim 1, wherein the organic compounds comprise at least one functional group selected from the group consisting of —OH, —CHO and —COOH and the metal oxide is completely reduced.

3. The method of claim 1, wherein the metal oxide thin film is at least 1 nm thick.

4. The method of claim 1, wherein depositing comprises at least three cycles of an atomic layer deposition (ALD) process.

5. The method of claim 1, wherein the organic compounds are in the vapor phase.

6. The method of claim 1, wherein the metal oxide thin film is selected from the group consisting of $ReO_2$, $Re_2O_5$, $ReO_3$, $RuO_2$, $OsO_2$, $CoO$, $Co_3O_4$, $Rh_2O_3$, $RhO_2$, $IrO_2$, $NiO$, $PdO$, $PtO_2$, $Cu_2O$, $CuO$, $Ag_2O$ and $Au_2O_3$.

7. The method of claim 1, wherein the ALD process comprises feeding into the reaction chamber and contacting the substrate with alternating vapor phase pulses of at least one first source chemical comprising a compound capable of adsorbing no more than a monolayer of metal species on the substrate and at least one second source chemical comprising a compound capable of oxidizing the metal species on the substrate into the metal oxide.

8. The method of claim 7, wherein the first source chemical is $Cu(thd)_2$ and the second source chemical is selected from the group consisting of ozone ($O_3$), oxygen ($O_2$) and a mixture of $O_3$ and $O_2$.

9. The method of claim 7, wherein the first source chemical is CuCl and the second source chemical is selected from the group consisting of ozone ($O_3$), oxygen ($O_2$) and a mixture of $O_3$ and $O_2$.

10. The method of claim 7, wherein the first source chemical is anhydrous metal nitrate and the second source chemical is vaporized aqueous solution of $NH_3$.

11. The method of claim 7, wherein the first source chemical is anhydrous copper nitrate ($Cu(NO_3)_2$) and the second source chemical is vaporized aqueous solution of $NH_3$.

12. The method of claim 7, wherein the first source chemical is $Co(thd)_3$ and the second source chemical is selected from the group consisting of ozone ($O_3$), oxygen ($O_2$), and a mixture of $O_3$ and $O_2$.

13. The method of claim 7, wherein the first source chemical is $Pd(thd)_3$ and the second source chemical is selected from the group consisting of ozone ($O_3$), oxygen ($O_2$), and a mixture of $O_3$ and $O_2$.

14. The method of claim 7, wherein the first source chemical is bis(ethylcyclopentadienyl)ruthenium (($EtCp)_2Ru$) and the second source chemical is a mixture of oxygen and water gases.

15. The method of claim 5, wherein the vaporized organic compound used for reducing the metal oxide is an organic compound containing at least one alcohol (—OH) group, said organic compound selected from the group consisting of primary alcohols; secondary alcohols; tertiary alcohols; polyhydroxy alcohols; cyclic alcohols which have an —OH group attached to at least one carbon atom which is part of a ring of 1–10 carbon atoms; aromatic alcohols having at least one —OH group attached either to the benzene ring or to a carbon atom in a side-chain attached to benzene ring; halogenated alcohols; and other derivatives of alcohols.

16. The method of claim 15, wherein said primary alcohols are primary alcohols according to the general formula (I)

wherein $R^1$ is a linear or branched $C_1$–$C_{20}$ alkyl or alkenyl group.

17. The method of claim 16, wherein each $R^1$ is selected from the group consisting of methyl, ethyl, propyl, butyl, pentyl and hexyl groups.

18. The method of claim 15, wherein said secondary alcohols are secondary alcohols according to formula (II)

wherein each $R^1$ is selected independently from the group of linear or branched $C_1$–$C_{20}$ alkyl and alkenyl groups.

19. The method of claim 18, wherein each $R^1$ is selected from the group consisting of methyl, ethyl, propyl, butyl, pentyl and hexyl groups.

20. The method of claim 15, wherein said tertiary alcohols are tertiary alcohols according to the general formula (III)

wherein each $R^1$ is selected independently from the group of linear or branched $C_1$–$C_{20}$ alkyl and alkenyl groups.

21. The method of claim 20, wherein each $R^1$ is selected from the group consisting of methyl, ethyl, propyl, butyl, pentyl and hexyl groups.

22. The method of claim 15, wherein said cyclic alcohols have an —OH group attached to at least one carbon atom which is part of a ring of 5–6 carbon atoms.

23. The method of claim 5, wherein the vaporized organic compound used for reducing the metal oxide is a compound containing at least one aldehyde (—CHO) group, said reducing agent being selected from the group consisting of:

compounds having the general formula (V)

$$R^3-CHO \quad (V)$$

wherein $R^3$ is hydrogen or linear or branched $C_1$-$C_{20}$ alkyl or alkenyl group, preferably methyl, ethyl, propyl, butyl, pentyl or hexyl; and compounds having the general formula (VI)

$$OHC-R^4-CHO \quad (VI)$$

wherein $R^4$ is a linear or branched $C_1$-$C_{20}$ saturated or unsaturated hydrocarbon or $R^4$ is zero, when the aldehyde groups are bonded to each other; and halogenated aldehydes; and other derivatives of aldehydes.

24. The method of claim 5, wherein the vaporized organic compound used for reducing the metal oxide is a compound containing at least one carboxylic acid (—COOH) group, said reducing agent being selected from the group consisting of:

compounds having the general formula (VII)

$$R^5COOH \quad (VII)$$

wherein $R^5$ is hydrogen or linear or branched $C_1$-$C_{20}$ alkyl or alkenyl group, preferably methyl, ethyl, propyl, butyl, pentyl or hexyl; and polycarboxylic acids; and halogenated carboxylic acids; and other derivatives of carboxylic acids.

25. A method of producing a conductive thin film comprising the steps of:

A. placing a substrate in a chamber;

B. exposing the substrate to a gaseous first reactant, wherein the first reactant adsorbs no more than a monolayer of metal species on the substrate;

C. removing gases from the chamber;

D. exposing the substrate to a second gaseous reactant comprising a compound that is capable of oxidizing the adsorbed metal species on the substrate into metal oxide;

E. removing gases from the chamber;

F. repeating the above steps B through E at least three times to form a metal oxide film; and G. following step F, exposing the substrate to one or more organic compounds.

26. The method of claim 25, wherein the organic compounds comprise at least one functional group selected from the group consisting of —OH, —CHO and —COOH and wherein the organic compound reduces the metal oxide.

27. The method of claim 25 wherein the organic compounds reduce the metal oxide film to metal.

28. The method of claim 25, wherein the organic compound is in the vapor phase.

29. The method of claim 25, wherein in step F, steps B through E are repeated at least 10 times to form a metal oxide film.

30. The method of claim 25, wherein steps B through G are repeated at least twice to increase the thickness of the conductive film on the substrate.

31. A method of producing a conductive thin film comprising:

depositing a metal oxide thin film of at least 1 urn thickness on a substrate; and reducing said metal oxide thin film to metal by exposing the metal oxide thin film to one or more organic compounds.

32. The method of claim 31, wherein the organic compounds comprise at least one functional group selected from the group consisting of —OH, —CHO and —COOH.

* * * * *

UNITED STATES PATENT AND TRADEMARK OFFICE
CERTIFICATE OF CORRECTION

PATENT NO. : 6,887,795 B2
DATED : May 3, 2005
INVENTOR(S) : Pekka J. Soininen et al.

It is certified that error appears in the above-identified patent and that said Letters Patent is hereby corrected as shown below:

<u>Column 20,</u>
Line 29, delete "1 urn" and insert -- 1 nm --.

Signed and Sealed this

Seventh Day of March, 2006

JON W. DUDAS
*Director of the United States Patent and Trademark Office*